US005894230A

United States Patent [19]

Voldman

[11] Patent Number: 5,894,230

[45] Date of Patent: Apr. 13, 1999

[54] MODIFIED KEEPER HALF-LATCH RECEIVER CIRCUIT

[75] Inventor: Steven H. Voldman, South Burlington, Vt.

[73] Assignee: International Business Machines Corporation, Armonk, N.Y.

[21] Appl. No.: 08/803,583

[22] Filed: Feb. 20, 1997

[51] Int. Cl.[6] .............................................. H03K 19/0185

[52] U.S. Cl. ................................ 326/86; 326/81; 326/83

[58] Field of Search ................................ 326/80, 81, 83, 326/86, 121, 17, 68, 22, 23; 327/333, 534, 215, 219, 222

[56] References Cited

U.S. PATENT DOCUMENTS 4,782,250 11/1988 Adams et al. .
4,836,885 6/1989 Breiten et al. .
4,963,766 10/1990 Lundberg .
5,117,129 5/1992 Hoffman et al. .
5,151,619 9/1992 Austin et al. .
5,319,259 6/1994 Merrill .................................... 307/443
5,543,733 8/1996 Mattos et al. ............................ 326/81
5,543,734 8/1996 Volk et al. ................................ 326/83
5,646,550 7/1997 Campbell, Jr. et al. .................. 326/81

*Primary Examiner*—Michael Tokar
*Assistant Examiner*—Qui Van Duong
*Attorney, Agent, or Firm*—Whitham, Curtis & Whitham; Howard J. Walter, Esq.

[57] ABSTRACT

An improved receiver circuit for making compatible data signals between semiconductor devices operating at different voltage levels is provided which is less prone to failure from electrostatic discharge (ESD) surges. The receiver comprises a half-latch keeper which is prevented from forward biasing during ESD surges thereby suppressing the establishment of harmful current paths which would otherwise pass through and damage receiver components.

12 Claims, 6 Drawing Sheets

MODIFIED KEEPER HALF-LATCH RECEIVER CIRCUIT

BACKGROUND OF THE INVENTION

1. Field of the Invention

The present invention generally relates to receiver circuits for making compatible semiconductor devices having different voltage requirements and, more particularly, to receiver circuits which are less prone to damage from electrostatic discharge (ESD).

2. Description of the Related Art

There are a multitude of integrated semiconductor devices such as metal oxide semiconductor (MOS) memories and transistor-transistor logic (TTL) devices which are designed to operate at higher voltages, typically 5V. As technology progresses, and higher density integration is realized, individual devices are becoming smaller. These smaller devices are more prone to so called hot electron effects and other deleterious effects at higher voltages. Hence, the trend is to design modern devices to operate at lower voltages. There are many advantages to using lower voltages. Switching times are typically faster since the voltage swing between logic states is not as great. Also, lower voltage devices consume less power and therefore conserve energy and generate less heat.

In a single system, such as a computer containing a microprocessor, memory, and various peripheral chips, there may be devices and families of devices present which operate at different voltages such as, for example, 5V, 3.3V, 2.5V, and 1.8V. Therefore, data signals communicating from one device to another must first be passed through a receiver circuit in order to be made compatible.

Dielectric over-voltage is an increasing concern in mixed voltage receiver circuit applications. Referring now to FIG. 1, there is shown a simple receiver which may be used, for example, to interface 5.0 V with a 2.5 V technology, 3.3 V with a 2.5 V technology, 3.3 V with a 1.8 V technology, or perhaps 2.5 V with a 1.8 V technology. An N-channel field effect transistor (NFET) pass transistor 10 may be used to lower the voltage on the receiver dielectric to avoid electrical overstress. The addition of the NFET pass transistor provides the advantage of noise filtration for signals presented at the input pad 12. Unfortunately, the NFET pass transistor 10 also introduces a voltage drop between an input pad 12 and the receiver 14 which may degrade the signal to an undeterminable level at the inverter portion 14 of the receiver.

Referring to FIG. 2, a solution to this voltage drop is shown employing a half-latch "keeper" circuit comprising a feedback FET 16 that pulls and "keeps" the node N at the input of the inverter 14 to a full Vdd power supply voltage as long as the output of a subsequent inverter 14 remains low. In this half-latch keeper circuit, the pad 12 is connected to an NFET pass transistor 10. The NFET pass transistor 10 is followed by an inverter comprising p-channel and n-channel MOSFETs (NFET 18 and PFET 20, respectively) connected between first and second voltage supplies. The center or output node M of the inverter 14 is fed back to the gate of the PFET 16. The PFET 16 source is connected to Vdd and the drain is connected to the inverter input node N.

Unfortunately, the addition of the PFET half-latch keeper transistor 16 is susceptible to electrostatic discharge (ESD) and tends to fail at relatively low ESD levels. For example, in certain semiconductor chips where all pins are at an ESD level over 8K V, the pins employing a half-latch keeper circuit tend to fail at only 2.5K V, thus indicating that this circuit is not ESD robust.

The primary reason for this ESD failure is that when the Vdd power supply is grounded, the PFET keeper's 16 source and well (body) are also grounded. When a positive polarity ESD impulse is applied to the input pad 12, a current path is established from the input pad 12, though the NFET pass transistor 10 to the p+ diode of the PFET 16 to ground (i.e., the PFET 16 becomes forward biased). The resulting current path which is established leads to failure of the PFET 16, and the NFET pass transistor 10. This is especially a concern with technologies that have a small channel length, a mixed voltage I/O circuit, or an ESD network with a late turn-on voltage. The failure mechanism results because when the PFET 16 diode establishes a ground potential, a single pass transistor exists. In this case, MOSFET snap-back occurs followed by MOSFET secondary breakdown, leading to a low ESD tolerance and device failure.

SUMMARY OF THE INVENTION

It is therefore an object of the present invention to provide an electrostatic discharge (ESD) robust receiver circuit for making compatible semiconductor devices having different voltage requirements.

According to the invention, a mixed voltage receiver circuit is provided which prevents a half latch keeper transistor from forward biasing thus eliminating the current path from the input pad through the NFET pass transistor during ESD surges. The novel half latch keeper comprises two transistors. A first feedback FET pulls the receiver input node to the full Vdd power supply voltage upon a low output from the receiver circuit. The input pad is connected to an NFET pass transistor which is followed by a CMOS inverter gate. The output node of the inverter is fed back to the half-latch transistor gate. The half-latch keeper source is connected to Vdd and the drain is connected to the inverter input node. In addition, a second PFET is provided having its source connected to Vdd and its drain connected to its V-well node and to the V-well node of the half-latch. The gate of the second PFET is connected to the input node. During an ESD surge, the second PFET keeps the half-latch keeper from becoming forward biased. Hence, with no current path established, the receiver circuit tends to become more ESD robust.

Additional embodiments are also disclosed which add additional components to allow for higher well voltages.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
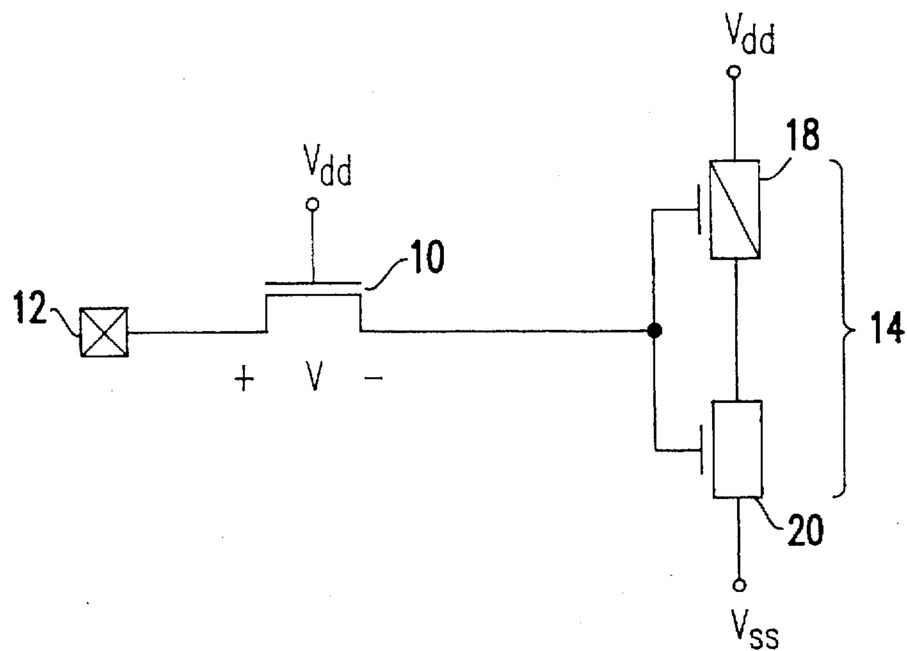
FIG. 1 is schematic of an exemplary receiver circuit.
Figure 2:
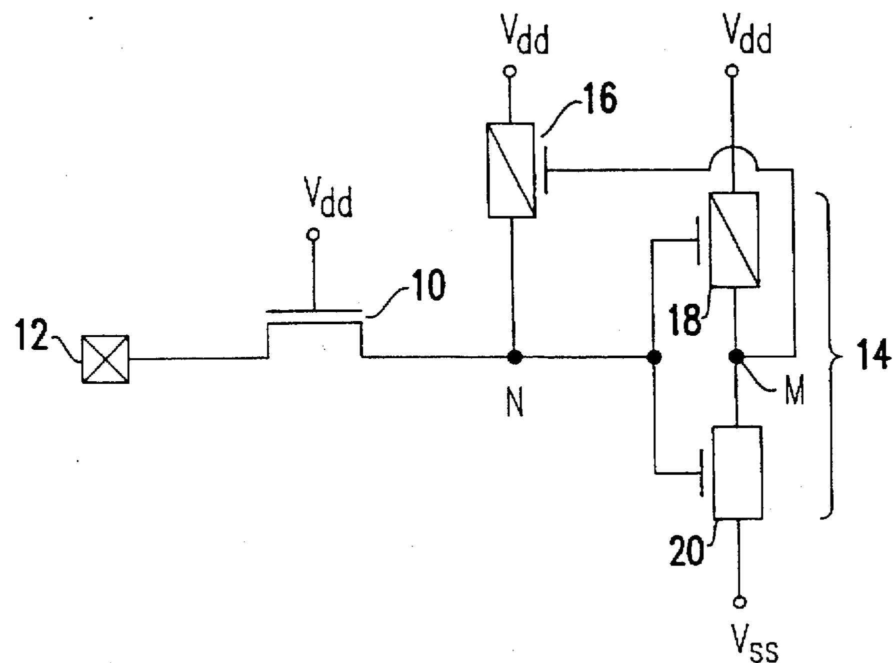
FIG. 2 is a schematic of a receiver circuit including a half-latch keeper circuit.
Figure 3:
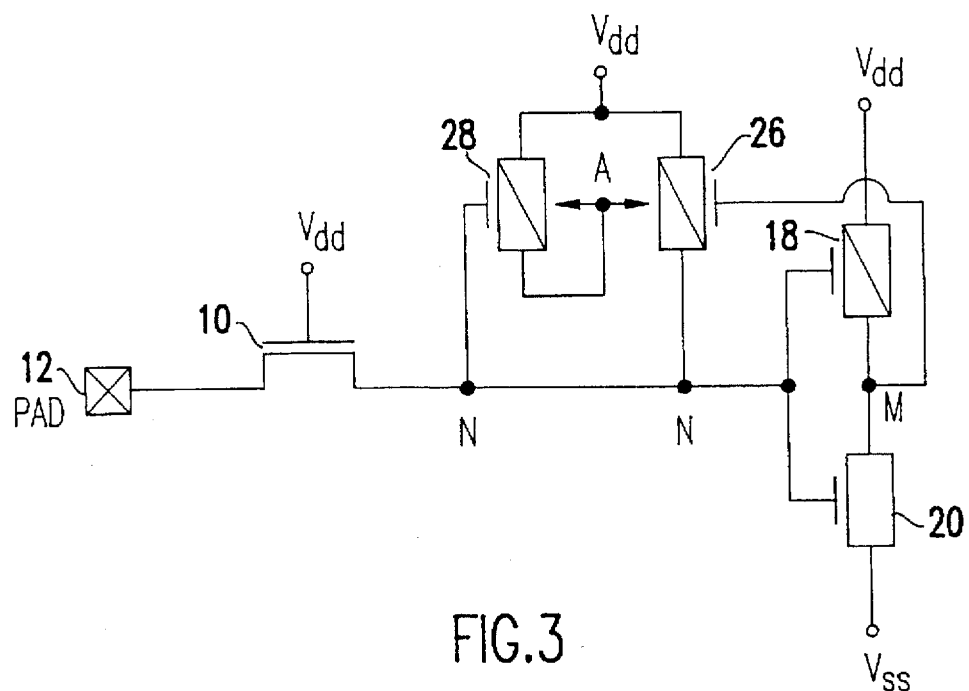
FIG. 3 is a receiver circuit according to the first embodiment of the present invention comprising a half-latch keeper circuit which is robust against electrostatic discharge (ESD)

Referring now to the drawings, and more particularly to FIG. 3, there is shown a receiver circuit according to the first embodiment of the present invention comprising a half-latch keeper circuit which is robust against electrostatic discharge (ESD).

In the first embodiment, an input pad 12 is connected to an NFET pass transistor 10. The NFET pass transistor 10 is followed by an inverter gate comprising a PFET 18 and an NFET 20 connected in series between a first voltage supply Vdd and a second voltage supply Vss. The output node M of the inverter is fed back to the gate of the PFET 26. The PFET 26 source electrode is connected to Vdd and the drain electrode is connected to the inverter input node N.

In addition, a second PFET 28 is provided having its source electrode connected to Vdd and its drain electrode connected to its V-well and to the V-well (node A) of the first PFET 26. The gate of the second PFET 28 is connected to receiver input node N. During functional operation, when the input pad 12 is below the power supply, the gate of the PFET 28 is biased low. When the gate of the PFET 28 is "0", the PFET 28 is "on". This causes current to flow to the well of PFET 28 and PFET 26, allowing $V_{well}$ to charge to Vdd. In this mode, the drain of the PFET 26 does not forward bias. When the pad 12 is raised above Vdd, the transistor PFET 28 is "off" allowing the $V_{well}$ node to float. In this state as the p+ drain of the PFET 26 forward biases, node A ($V_{well}$)rises, charging up $V_{well}$ to a voltage of $V_{pad}$–Vbe, where $V_{pad}$ is the pad voltage.

During an ESD event, when Vpad>Vdd$_{+}$=0, the $V_{well}$, node A, also follows the input voltage($V_{pad}$–Vbe) preventing continuous dc current from flowing through PFET 26. As a result, the PFET 26 drain does not become "pinned" to the ground potential Vdd=0. Hence, node N does not stay at Vbe above ground potential. The net voltage across the pass transistor 10 stays below the snap-back voltage and the transistor does not undergo MOSFET breakdown. Hence, with no continuous dc current path established the receiver circuit tends to become more ESD robust.

Figure 4:
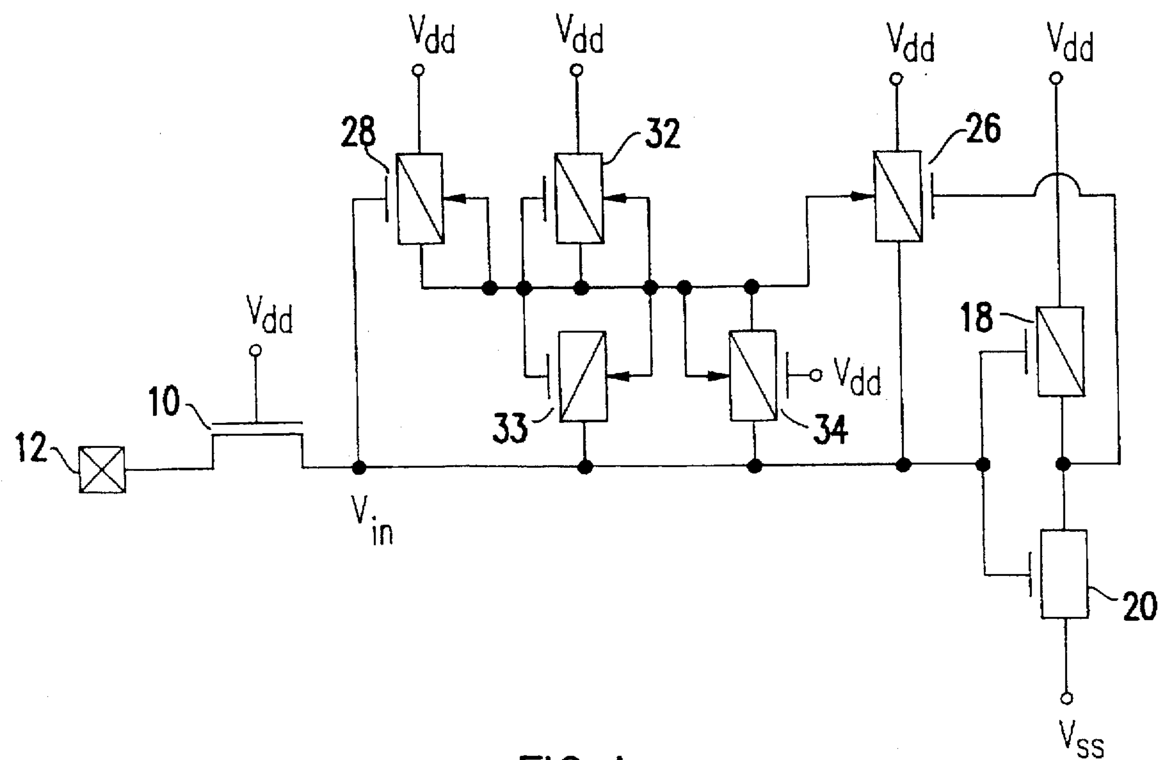
FIG. 4 is a receiver circuit according to a second embodiment of the present invention comprising a half-latch keeper circuit which is robust against electrostatic discharge (ESD)
Figure 5A:
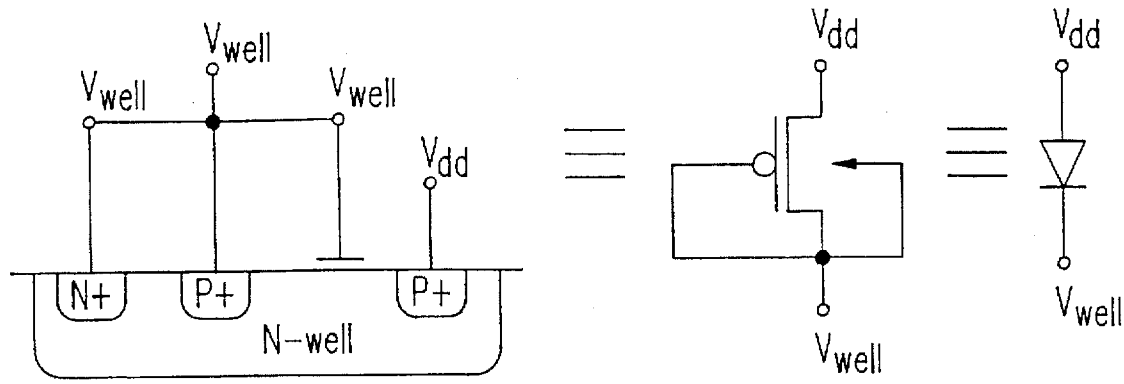
FIGS. 5A–5C are equivalent circuit diagrams for various transistors shown in FIG. 4.
Figure 5B:
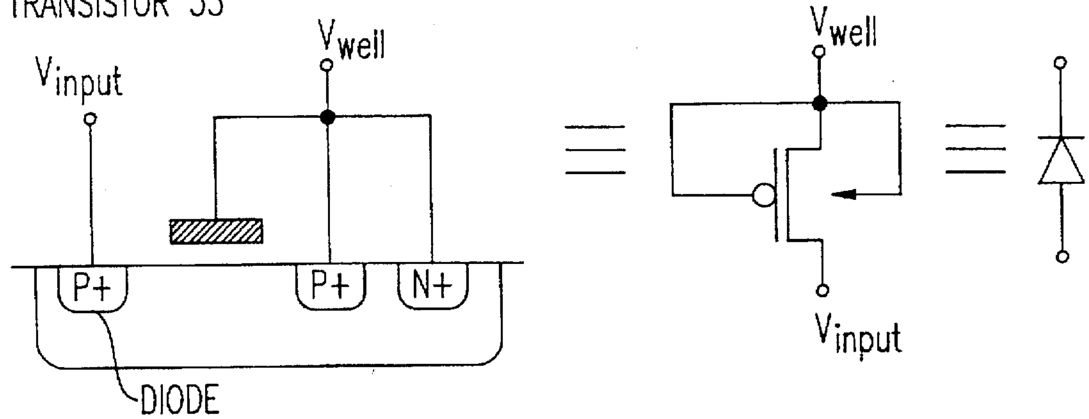
Figure 5C:
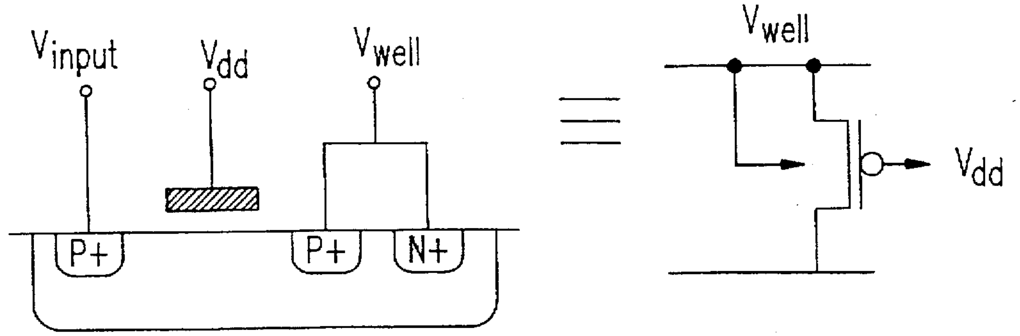

Referring now to FIGS. 4 and 5, there is shown a second embodiment of the present invention which allows for higher well stability. The receiver is similar to the that described in the first embodiment with the addition of PFETs 32, 33, and 34. PFET 32 is connected between Vdd and $V_{well}$. PFET 33 is connected between $V_{in}$ and Vdd and PFET 34 is shown connected between $V_{well}$ and $V_{in}$ with its gate connected to Vdd. FIGS. 5A–5C show equivalent circuits for PFETS 32, 33, and 34, respectively.

With regard to PFET 32, as shown in FIG. 5A, the function of this transistor is to behave in a diode "on" mode when $V_{Well}$ is well below Vdd, and in a MOSFET transistor "off" mode when $V_{Well}$ is above Vdd. As can be seen in FIG. 5A, if Vdd>>$V_{Well}$ the source of the PFET 32 forward biases (P-N junction) charging up the $V_{Well}$. Hence, the PFET 32 turns on because its gate will be low. Correspondingly, if $V_{Well}$>>Vdd, the drain if the PFET 32 does not forward bias since the well is at the same potential, the gate is high and the source and drain is off.

With regard to the PFET 33, as shown in FIG. 5B, the function of this transistor is to keep the "floating well" within a diode voltage of the input voltage $V_{in}$ when $V_{in}$>>Vdd. When $V_{in}$<Vdd, transistor 28 is "on", raising $V_{Well}$=Vdd. When $V_{Well}$=Vdd, transistor 33 is "off" because the body (well) is high, the gate is high so transistor 33 is in an off state. Similarly, when $V_{in}$>Vdd, transistor 28 is "off", causing $V_{well}$ to float. As can be seen in FIG. 5B transistor 33 forces $V_{Well}$ to keep "floating well" within a diode voltage of the input voltage when $V_{in}$>Vdd.

With regard to transistor 34, as shown in FIG. 5C, when $V_{in}$<Vdd and $V_{well}$=Vdd, transistor 34 will be off. When $V_{in}$>>Vdd, $V_{Well}$ will float. In this state, transistor 34 will be "on". As the transistor 34 turns on, its source (connected to the well) will rise with the well, raising the floating well voltage $V_{Well}$ until the transistor shuts off (i.e., when $V_{well}$=$V_{in}$).

Figure 6:
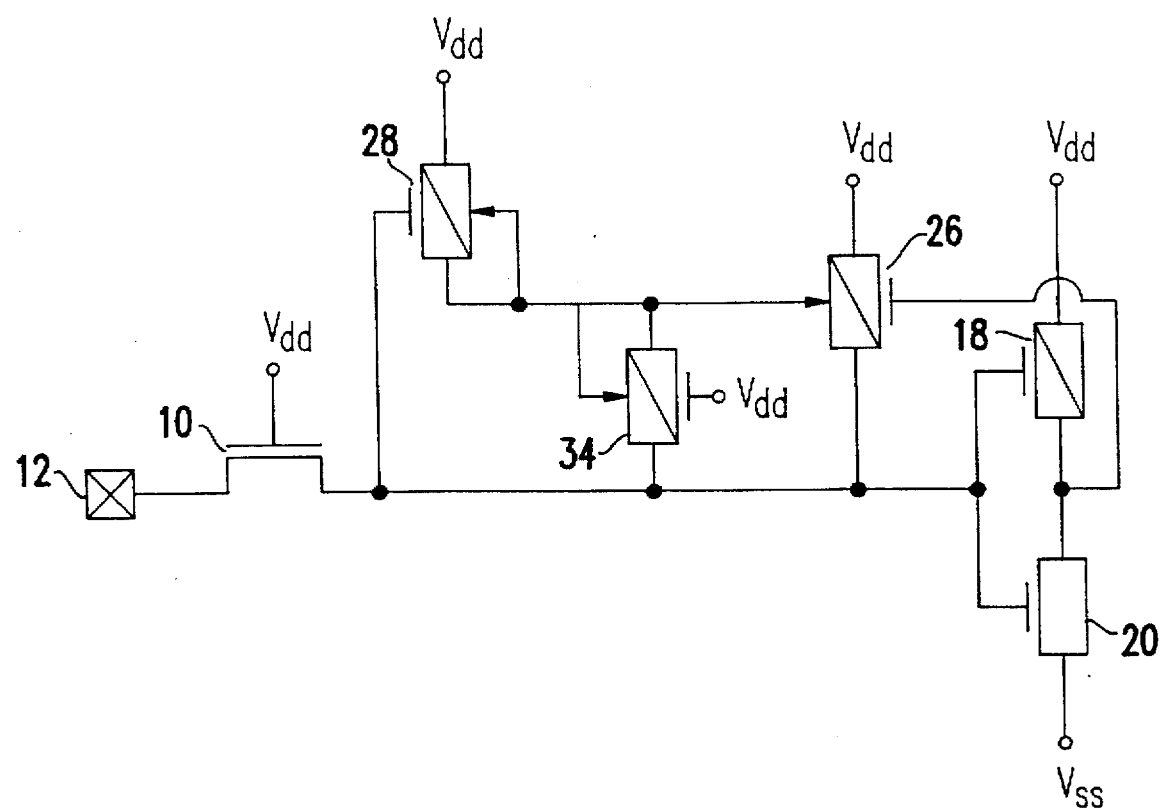
FIG. 6 is a receiver circuit according to a third embodiment of the present invention comprising a half-latch keeper circuit which is robust against electrostatic discharge (ESD)

Referring now to FIG. 6, there is shown yet a third embodiment of the present invention similar to that shown in FIG. 4 except only employing additional transistor 34 connected between $V_{well}$ and $V_{in}$ with its gate connected to Vdd. Just as above, with reference to FIG. 5C, when $V_{in}$>>Vdd, $V_{Well}$ will float. In this state, transistor 34 will be "on". As the transistor 34 turns on, it source (connected to the well) will rise with the well, raising the floating well voltage $V_{Well}$ until the transistor shuts off (i.e., when $V_{well}$=$V_{in}$). Hence, higher well voltages are attainable resulting in immunity to high voltage ESD surges.

FIGS. 7A–7D show variations of a fourth embodiment of the present invention employing a resistor at various points in the receiver circuit shown in FIG. 3 in order to enhance the keeper circuit.

Figure 7A:
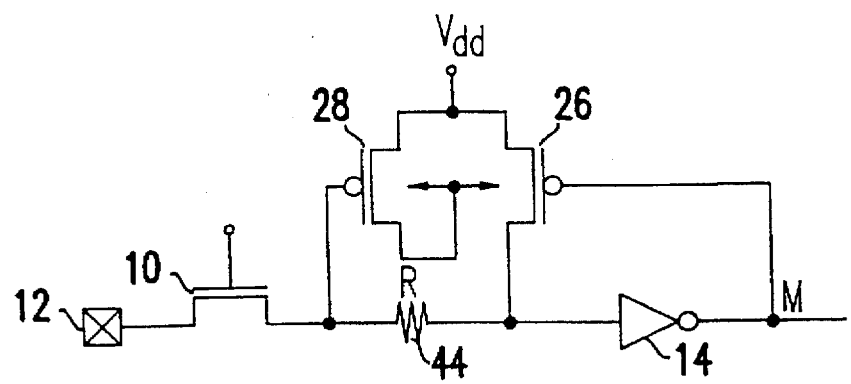
FIGS. 7A–7D are circuit diagrams of a fourth embodiment of the present invention showing a resistor placed in various parts of the circuit.

Referring to FIG. 7A, the receiver circuit shown in FIG. 3 additionally includes a resistor element 44 between NFET pass transistor 10 and the receiver inverter 14 input. The resistor 44 protects the keeper circuit by establishing a high impedance with the PFET keeper 26 to prevent over-voltage to the receiver inverter 14 and tends to make the receiver more ESD robust. In operation, the resistor 44 provides a voltage drop in series with the NFET 10, reducing the voltage across the NFET 10 during an ESD event. It also establishes a high impedance element in series the inverter 14 gate structures, thus avoiding charged device mechanism (CDM) failure mechanism failures.

Figure 7B:
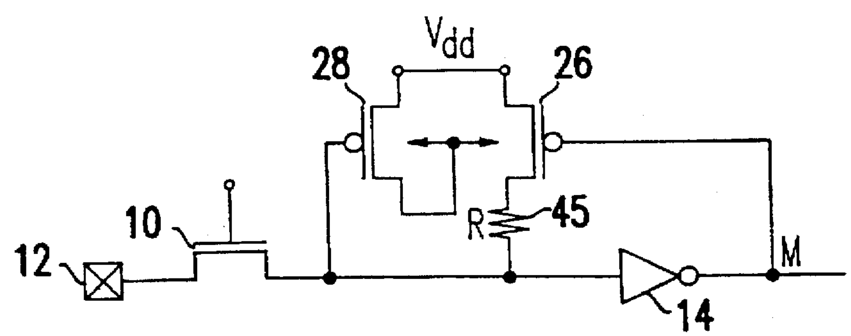

Referring to FIG. 7B, the receiver circuit shown in FIG. 3 additionally includes a resistor element 45 between the drain of the PFET keeper 26 and the receiver inverter 14 input. In this circuit, the resistor element 45 establishes a high impedance current limit for the PFET keeper 26 without RC (resistance×capacitance) delay to the receiver inverter 14. Further, this prevents both PFET and diode action of the keeper PFET 26.

Figure 7C:
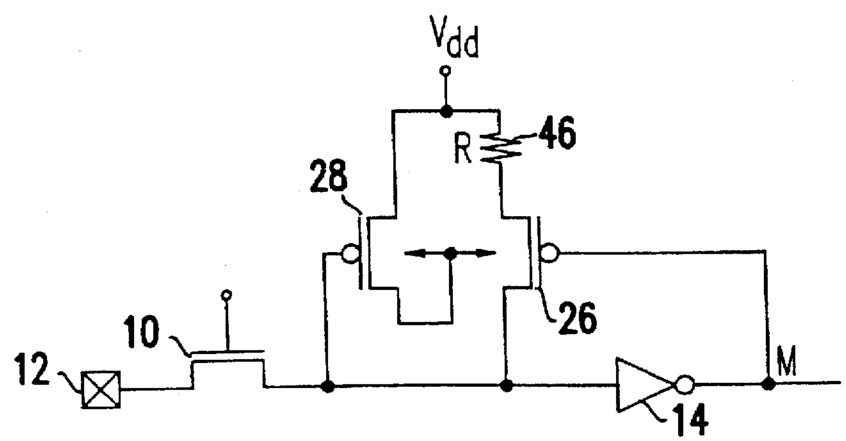

Similarly, referring to FIG. 7C, the receiver circuit shown in FIG. 3 additionally includes a resistor element 46 connected between the PFET keeper's 26 source electrode and Vdd. In this case, the additional resistor 46 eliminates PFET action of the keeper 26 only. In both FIGS. 7B and 7C, the resistor, 45 or 46, creates a voltage drop in series with the PFET keeper 26, preventing over-voltage of the PFET keeper 26.

Figure 7D:
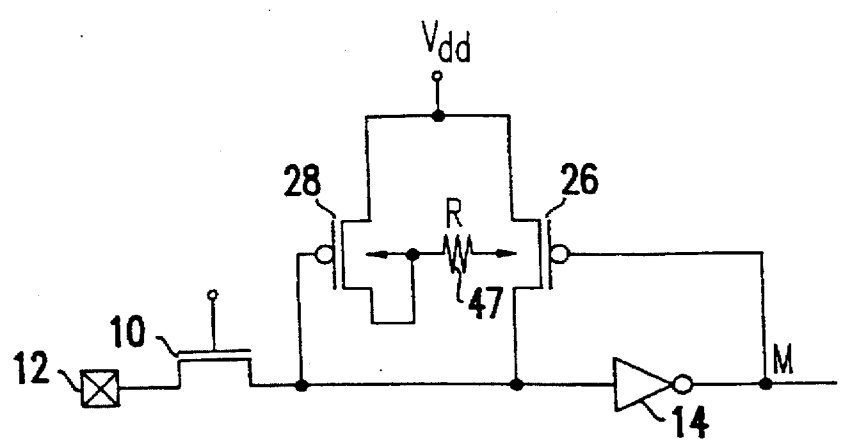

Referring to FIG. 7D, the receiver circuit shown in FIG. 3 additionally includes a resistor element 47 connected between the drain electrode of PFET 28 and the body connection of the PFET keeper 26. The resistor 47 increases the impedance to the Vdd power supply rail. In this case, the additional resistor establishes a high impedance element with the diode action of the PFET keeper 26 only.

Figure 8:
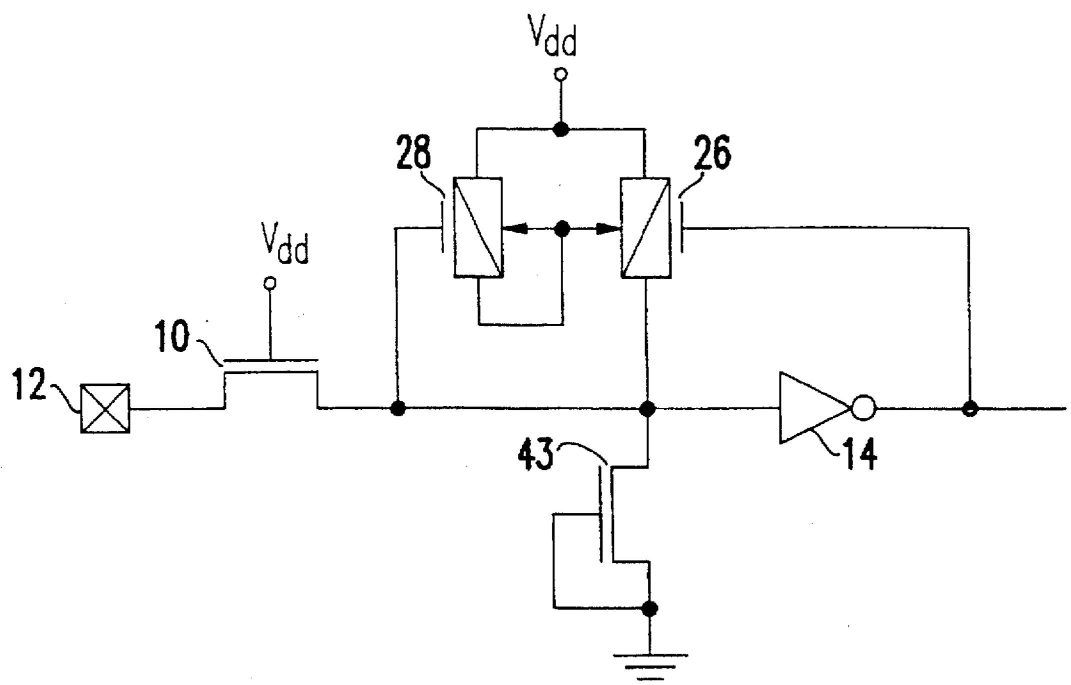
FIG. 8 is a receiver circuit according to a fifth embodiment of the present invention.

Referring now to FIG. 8, there is shown yet a fifth embodiment of the present invention. In this arrangement, the circuit of FIG. 3 additionally includes a transistor 43 connected between the keeper 26 and ground. Here, the function of the transistor 43 is to limit dielectric voltage by undergoing MOSFET snap-back prior to receiver 14 dielectric breakdown. The transistor 43 limits voltage excursion which occurs through the keeper circuit by forming a voltage divider with the NFET pass transistor 10 hence, acting like a voltage clamp and acting as an alternative current path instead of going through the receiver keeper 26.

Figure 9:
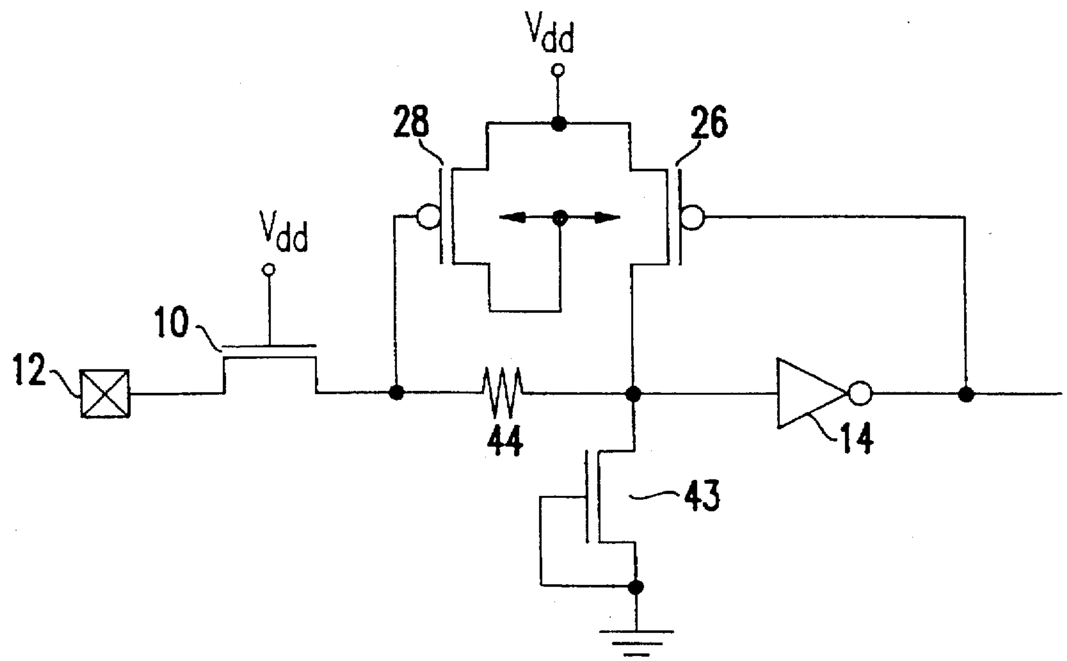
FIG. 9 is a receiver circuit according to a sixth embodiment of the present invention.

Referring now to FIG. 9, similar to FIG. 8, the circuit additionally includes a NFET transistor 43 connected between the keeper 26 and ground as well as a resistor 44 connected between the NFET pass transistor 10 and the resistor 44. An advantage to this circuit is that it provides a high impedance element in series with the PFET keeper 26 and establishes a resistive divider network (resistor 44 and dynamic resistance of the transistor 43). This minimizes over-voltage of the inverter 14, the keeper 26, and limits the voltage across the NFET 10.

While the invention has been described in terms of a single preferred embodiment, those skilled in the art will recognize that the invention can be practiced with modification within the spirit and scope of the appended claims.

We claim:

1. A receiver for making compatible devices operating at different voltage levels, comprising:

an input pad for receiving a signal at a first logic level;

an inverter connected between a first voltage source and a second voltage source for outputting a signal at a second logic level;

a pass transistor for passing said signal from said input pad to an input node of said inverter;

a half-latch keeper transistor for holding said input node of said inverter at a logic high from said first voltage source when an output of said inverter is at a logic low; and means, connected to said half-latch keeper transistor, for preventing said half-latch keeper transistor from becoming forward biased during a voltage surge.

2. A receiver for making compatible devices operating at different voltage levels as recited in claim 1 wherein said means for preventing said half-latch keeper transistor from becoming forward biased comprises a first transistor having a source electrode connected to said first voltage source, a drain electrode connected to a body electrode of said half-latch keeper transistor, and a gate connected to an output of said pass transistor.

3. A receiver for making compatible devices operating at different voltage levels as recited in claim 2 further comprising:

a third transistor connected between said body electrode of said half-latch keeper transistor and said output of said pass transistor, and a gate electrode connected to said first voltage source; and a transistor pair, comprising a fourth and fifth transistor, connected in series between said first voltage source and said output of said pass transistor, each transistor in said pair having its gate electrode and its body electrode connected to said body electrode of said half-latch keeper transistor.

4. A receiver for making compatible devices operating at different voltage levels as recited in claim 2 further comprising:

a third transistor connected between said body electrode of said half-latch keeper transistor and said output of said pass transistor, and a gate electrode connected to said first voltage source.

5. A receiver for making compatible devices operating at different voltage levels as recited in claim 2 further comprising a resistor connected between said output of said pass transistor and an input of said inverter.

6. A receiver for making compatible devices operating at different voltage levels as recited in claim 2 further comprising a resistor connected between said half-latch keeper transistor and said output of said pass transistor.

7. A receiver for making compatible devices operating at different voltage levels as recited in claim 2 further comprising a resistor connected between said first voltage source and said half-latch keeper transistor.

8. A receiver for making compatible devices operating at different voltage levels as recited in claim 2 further comprising a resistor connected between said drain electrode of said first transistor and said body electrode of said half-latch-keeper transistor.

9. A receiver for making compatible devices operating at different voltage levels as recited in claim 2 further comprising a voltage divider transistor connected between said half-latch keeper transistor and ground.

10. A receiver for making compatible devices operating at different voltage levels as recited in claim 2 further comprising:

a voltage divider transistor connected between said half-latch keeper transistor and ground; and a resistor connected between said output of said pass transistor and said half-latch keeper transistor.

11. A receiver circuit, comprising:

an input pad for receiving a signal at a first voltage level;

an inverter connected between a first voltage source and a second voltage source;

a pass transistor for passing said signal from said input pad to an input node of said inverter;

a half-latch keeper transistor for holding said input node of said inverter at a logic high from said first voltage source when an output of said inverter is at a logic low;

a first transistor connected to said half-latch keeper transistor, for preventing said half-latch keeper transistor from becoming forward biased during a voltage surge, said first transistor having a source electrode connected to said first voltage source, a drain electrode connected to a body electrode of said half-latch keeper transistor, and a gate connected to an output of said pass transistor; and a voltage divider transistor connected between said half-latch keeper transistor and ground.

12. A receiver circuit as recited in claim 11 further comprising a resistor connected between said output of said pass transistor and said half-latch keeper transistor.

* * * * *